(12) United States Patent
Kang et al.

(10) Patent No.: US 11,587,941 B2
(45) Date of Patent: Feb. 21, 2023

(54) METHOD OF PLANARIZING INSULATING LAYER FOR MEMORY DEVICE

(71) Applicant: SK hynix Inc., Icheon-si (KR)

(72) Inventors: Byung Woo Kang, Incheon (KR); Sae Jun Kwon, Seoul (KR); Hwal Pyo Kim, Suwon-si (KR); Jin Taek Park, Suwon-si (KR); Yang Seok Lim, Icheon-si (KR); Young Ock Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 197 days.

(21) Appl. No.: 16/850,591

(22) Filed: Apr. 16, 2020

(65) Prior Publication Data
US 2021/0057431 A1 Feb. 25, 2021

(30) Foreign Application Priority Data

Aug. 20, 2019 (KR) .................. KR10-2019-0101738

(51) Int. Cl.
*H01L 27/11556* (2017.01)
*H01L 27/11582* (2017.01)
*H01L 21/822* (2006.01)
*H01L 21/762* (2006.01)
*H01L 21/8234* (2006.01)

(52) U.S. Cl.
CPC .. *H01L 27/11556* (2013.01); *H01L 21/76224* (2013.01); *H01L 21/76227* (2013.01); *H01L 21/76229* (2013.01); *H01L 21/822* (2013.01); *H01L 21/823481* (2013.01); *H01L 27/11582* (2013.01)

(58) Field of Classification Search
CPC ......... H01L 27/11556; H01L 27/11582; H01L 27/11521; H01L 27/11568; H01L 27/1151; H01L 21/76224; H01L 21/76229; H01L 21/823481; H01L 21/822
See application file for complete search history.

(56) References Cited

U.S. PATENT DOCUMENTS

| | | | | |
|---|---|---|---|---|
| 2015/0048475 | A1* | 2/2015 | Tsai | H01L 21/76229 257/506 |
| 2017/0317088 | A1* | 11/2017 | Lee | H01L 27/11582 |
| 2018/0337087 | A1* | 11/2018 | Sandhu | H01L 29/0649 |

FOREIGN PATENT DOCUMENTS

| | | |
|---|---|---|
| KR | 100596834 B1 | 7/2006 |
| KR | 1020120030193 A | 3/2012 |

OTHER PUBLICATIONS

Holzner, S., "How Surface Area Affects the Force of Friction", dummies, A Wiley Brand, Mar. 26, 2016, https://www.dummies.com/article/academics-the-arts/science/physics/how-surface-area-affects-the-force-of-friction-174225?keyword=force%20of%20friction%20and%20surface, accessed Feb. 11, 2022. (Year: 2016).*

* cited by examiner

*Primary Examiner* — Davienne N Monbleau
*Assistant Examiner* — Nader M Elmarhoumi
(74) *Attorney, Agent, or Firm* — William Park & Associates Ltd.

(57) ABSTRACT

A method of manufacturing a semiconductor device includes forming a stacked structure including trenches having different depths, forming an insulating layer on the stacked structure to fill the trenches, and forming a plurality of protrusions located corresponding to locations of the trenches by patterning the insulating layer. The method also includes forming insulating patterns filling the trenches, respectively, by planarizing the patterned insulating layer including the plurality of protrusions.

20 Claims, 16 Drawing Sheets

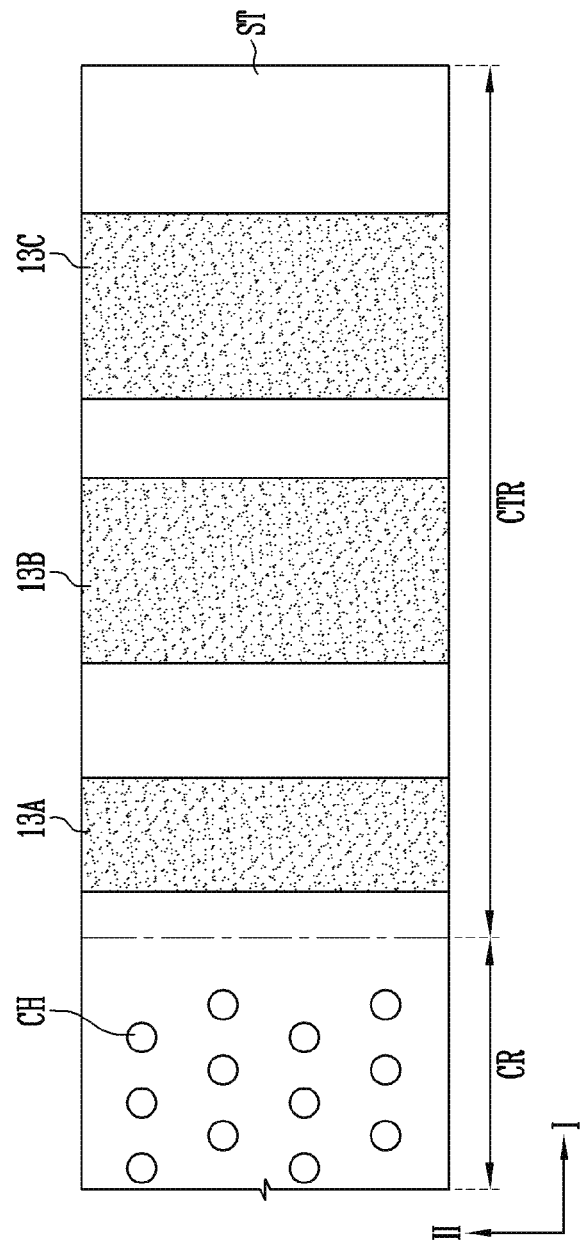

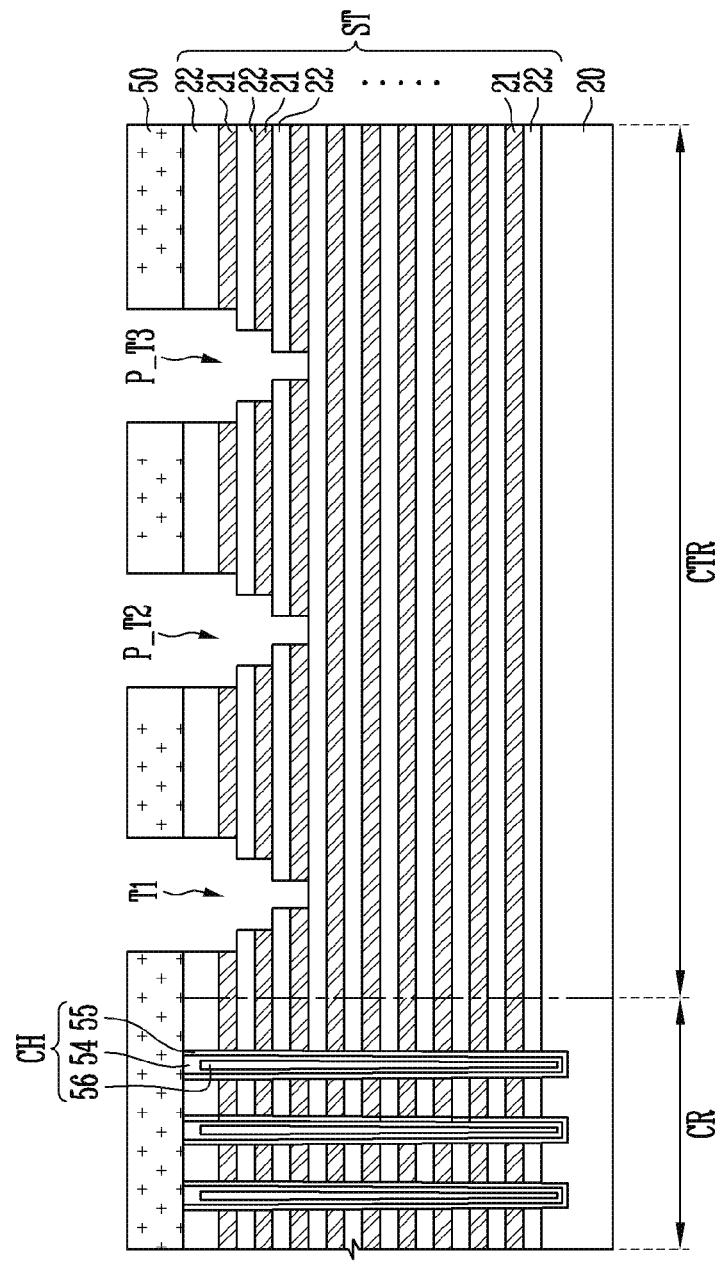

METHOD OF PLANARIZING INSULATING LAYER FOR MEMORY DEVICE

CROSS-REFERENCE TO RELATED APPLICATION

The present application claims priority under 35 U.S.C. § 119(a) to Korean patent application number 10-2019-0101738 filed on Aug. 20, 2019, in the Korean Intellectual Property Office, the entire disclosure of which is incorporated herein by reference.

BACKGROUND

1. Technical Field

Various embodiments relate generally to a semiconductor device and, more particularly, to a method of manufacturing a semiconductor device.

2. Related Art

Non-volatile memory devices retain stored data regardless of power availability. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes that are alternately stacked with each other, and channel layers passing therethrough, with memory cells stacked along the channel layers. Various structures and manufacturing methods have been developed to improve the operational reliability of three-dimensional non-volatile memory devices.

SUMMARY

According to an embodiment of the present disclosure, a method of manufacturing a semiconductor device may include forming a stacked structure including trenches having different depths, forming an insulating layer on the stacked structure to fill the trenches, and forming a plurality of protrusions located corresponding to the trenches by patterning the insulating layer. The method may also include forming insulating patterns filling the trenches, respectively, by planarizing the patterned insulating layer including the plurality of protrusions.

According to an embodiment of the present disclosure, a method of manufacturing a semiconductor device may include forming a stacked structure including a cell region and a contact region. The method may also include forming, in the contact region of the stacked structure, a first trench adjacent to the cell region and a second trench apart from the cell region. The method may further include forming an insulating layer on the stacked structure to fill the first and second trenches and patterning the insulating layer to form a first protrusion corresponding to the first trench and a second protrusion corresponding to the second trench, wherein the second protrusion is wider than the first protrusion. The method may additionally include planarizing the patterned insulating layer including the first protrusion and the second protrusion.

BRIEF DESCRIPTION OF THE DRAWINGS

FIGS. 1A and 1B are diagrams illustrating a structure of a semiconductor device according to an embodiment of the present disclosure.

FIGS. 2A to 2F are diagrams illustrating a method of manufacturing a semiconductor device according to an embodiment of the present disclosure.

DETAILED DESCRIPTION

Hereinafter, specific structural or functional descriptions of embodiments in accordance with concepts which are disclosed in this specification are illustrated only to describe the embodiments. Concepts and embodiments in accordance with the present teachings may be realized by various forms and are not specifically limited to the embodiments described in this specification.

Various embodiments are directed to semiconductor devices and manufacturing processes for the semiconductor devices. These semiconductor devices may have stabilized structures and improved characteristics over current state-of-the-art semiconductor devices.

Figure 1B:
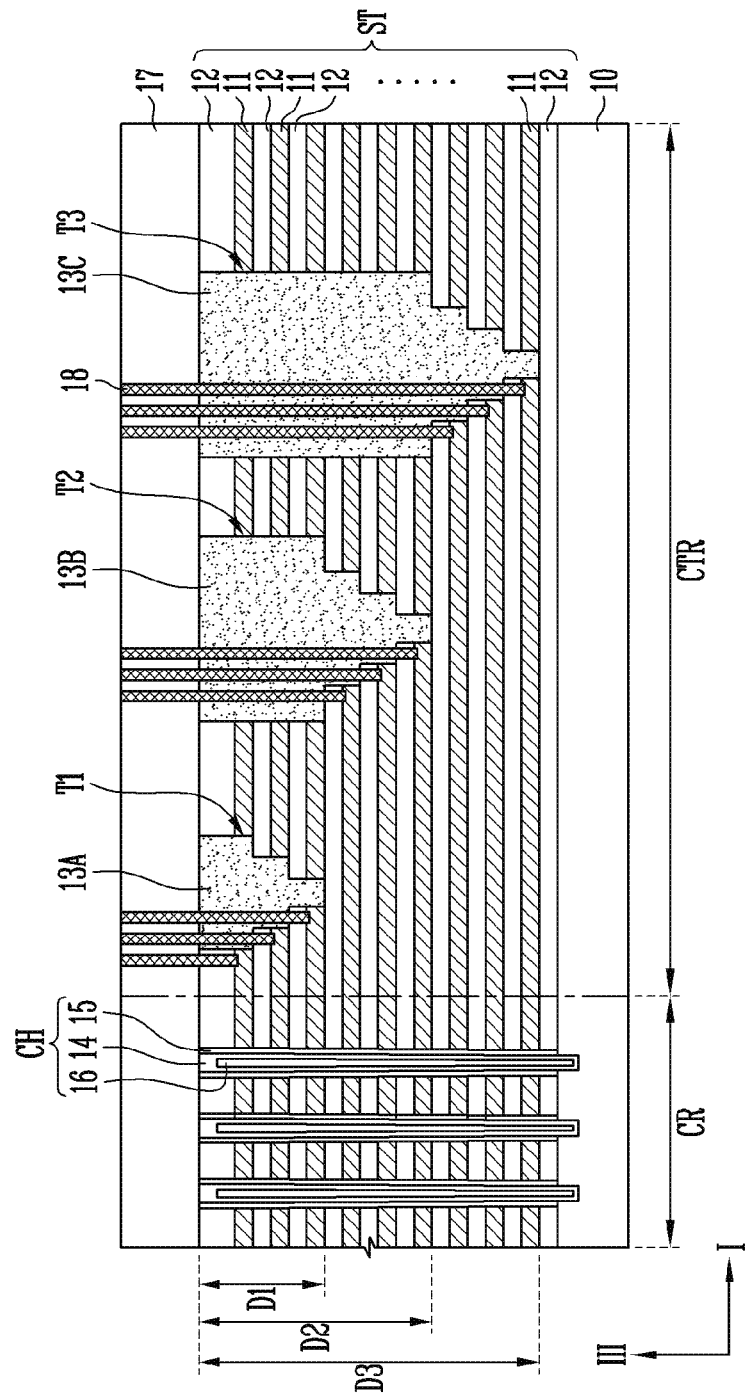

FIGS. 1A and 1B are diagrams illustrating a structure of a semiconductor device according to an embodiment of the present disclosure. FIG. 1A is a layout view and FIG. 1B is a cross-sectional diagram of FIG. 1A in a first direction I.

Referring to FIGS. 1A and 1B, the semiconductor device may include a base 10, a stacked structure ST, and first to third insulating patterns 13A to 13C. In addition, the semiconductor device may include a channel structure CH, an interlayer insulating layer 17, and a contact plug 18.

The stacked structure ST may be located on the base 10. The base 10 may be a semiconductor substrate and include a lower structure including a peripheral circuit or a source structure.

The stacked structure ST may include conductive layers 11 and insulating layers 12 alternately stacked with each other.

The conductive layers 11 may be gate electrodes such as select transistors and memory cells. The conductive layers 11 may include polysilicon, tungsten, metal, and the like. The insulating layers 12 may be provided to insulate the stacked gate electrodes from each other and may include an insulating material such as oxides and nitrides.

The stacked structure ST may include at least one cell region CR and at least one contact region CTR. The cell region CR may refer to a region where memory strings are located. Each of the memory strings may include stacked memory cells. The contact region CTR may refer to a region where an interconnection structure coupled to the memory strings is located. The interconnection structure may include a contact plug, a line, and the like.

The cell region CR and the contact region CTR may neighbor each other in the first direction I. The cell region CR may be located between contact regions CTR. On the other hand, the contact region CTR may be located between cell regions CR.

The stacked structure ST may include a plurality of trenches T1 to T3. The plurality of trenches T1 to T3 may be located in the contact region CTR and have different depths D1 to D3 from each other. The trenches T1 to T3 may expose different conductive layers 11 and have stepped inner walls. The trenches T1 to T3 may include inner walls facing each other in the first direction I. The inner walls of the trenches T1 to T3 may have a symmetrically or asymmetrically stepped shape. In addition, at least one conductive layer 11 and at least one insulating layer 12 may constitute a single step of the stepped structure. The conductive layer 11 or the insulating layer 12 may be located on the top of each step.

The trenches T1 to T3 may be arranged in the first direction I and extend in a second direction II crossing the first direction I. The first to third trenches T1 to T3 may be sequentially arranged so that the depths thereof may increase away from the cell region CR. However, the first to third trenches T1 to T3 may be randomly arranged regardless of their depths.

The first trench T1 may expose at least one uppermost conductive layer 11 and have the shallowest depth D1 among the trenches T1 to T3. The entire inner wall of the first trench T1 may have a stepped shape. The third trench T3 may expose at least one lowermost conductive layer 11 and have the deepest depth D3 among the trenches T1 to T3. The second trench T2 may expose the remaining conductive layers 11 and may have a depth greater than the first trench T1 and less than the third trench T3 (D1<D2<D3).

A portion of the inner wall of each of the second and third trenches T2 and T3 may have a stepped shape. A portion of the inner wall of the second trench T2 that overlaps the first trench T1 may have a vertical profile and the other portion thereof may have a stepped shape. A portion of the third trench T3 which overlaps the first and second trenches T1 and T2 may have a vertical profile and the other portion thereof may have a stepped shape.

Insulating patterns 13A to 13C may be formed in the first to third trenches T1 to T3, respectively. The first insulating pattern 13A may be formed in the first trench T1, the second insulating pattern 13B may be formed in the second trench T2, and the third insulating pattern 13C may be formed in the third trench T3.

Upper surfaces of the first to third insulating patterns 13A to 13C may be located at substantially the same level as a top surface of the stacked structure ST. The upper surfaces of the first to third insulating patterns 13A to 13C may be located in substantially the same plane as a top surface of the stacked structure ST.

The interlayer insulating layer 17 may be located over the stacked structure ST and the first to third insulating patterns 13A to 13C. The contact plugs 18 may pass through the interlayer insulating layer 17 and the first to third insulating patterns 13A to 13C and be coupled to the conductive layers 11, respectively.

The channel structures CH may pass through the cell region CR of the stacked structure ST. The channel structures CH may be arranged in the first direction I and the second direction II. In addition, the channel structures CH may pass through the stacked structure ST in a third direction III. The third direction III may be orthogonal to the plane defined in the first direction I and the second direction II.

Each of the channel structures CH may include a channel layer 14, a memory layer 15, and a gap-filling layer 16. The channel layer 14 may pass through the stacked structure ST in the third direction III. The channel layer 14 may extend to the base 10 and be electrically coupled to a source structure included in the base 10. The memory layer 15 may surround a sidewall of the channel layer 14, or may be interposed between the channel layer 14 and the conductive layers 11. The memory layer 15 may include at least one of a tunnel insulating layer, a data storage layer, and a charge blocking layer. The data storage layer may include a floating gate, a charge trapping material, polysilicon, a nitride, nanodots, or a phase change material. The gap-filling layer 16 may be formed in the channel layer 14. The gap-filling layer 16 may include an insulating material such as an oxide.

In this embodiment, the case in which the stacked structure ST includes the three trenches T1 to T3 has been described. However, the present teachings are not limited to three trenches. The number, shape, and arrangement of trenches may vary depending on the number of conductive layers 11 included in the stacked structure ST. In addition, the numbers, shapes, and arrangements of the insulating patterns 13A to 13C and the contact plugs 18 may be changed accordingly.

FIGS. 2A to 2F are cross-sectional diagrams illustrating a method of manufacturing a semiconductor device according to an embodiment. Hereinafter, repeated descriptions of common contents already described above are omitted.

Referring to FIG. 2A, the stacked structure ST may be formed on a base 20. The base 20 may be a semiconductor substrate and include a lower structure such as a peripheral circuit or a source structure. In addition, the base 20 may include a sacrificial layer for forming a source layer.

The stacked structure ST may include the cell region CR and the contact region CTR. In addition, the stacked structure ST may include first material layers 21 and second material layers 22 which are alternately stacked with each other. The first material layers 21 may be provided to form gate electrodes of memory cells and select transistors. The second material layers 22 may be provided to insulate the stacked gate electrodes from each other. The first material layers 21 may include a material having high etch selectivity with respect to the second material layers 22. For example, the first material layers 21 may be sacrificial layers including nitride or the like, and the second material layers 22 may be insulating layers including oxide or the like. In another example, the first material layers 21 may be conductive layers including polysilicon, tungsten, or the like, and the second material layers 22 may be insulating layers including oxide or the like.

Subsequently, the channel structures CH may be formed. First, openings may be formed through the cell region CR, and memory layers 55 and channel layers 54 may be formed in the openings. The channel layers 54 may include gap-filling layers 56. The channel structure CH may be electrically coupled to the source structure of the base 20. However, the channel structure CH and the source structure of the base 20 may be electrically coupled during subsequent processes.

Figure 2B:
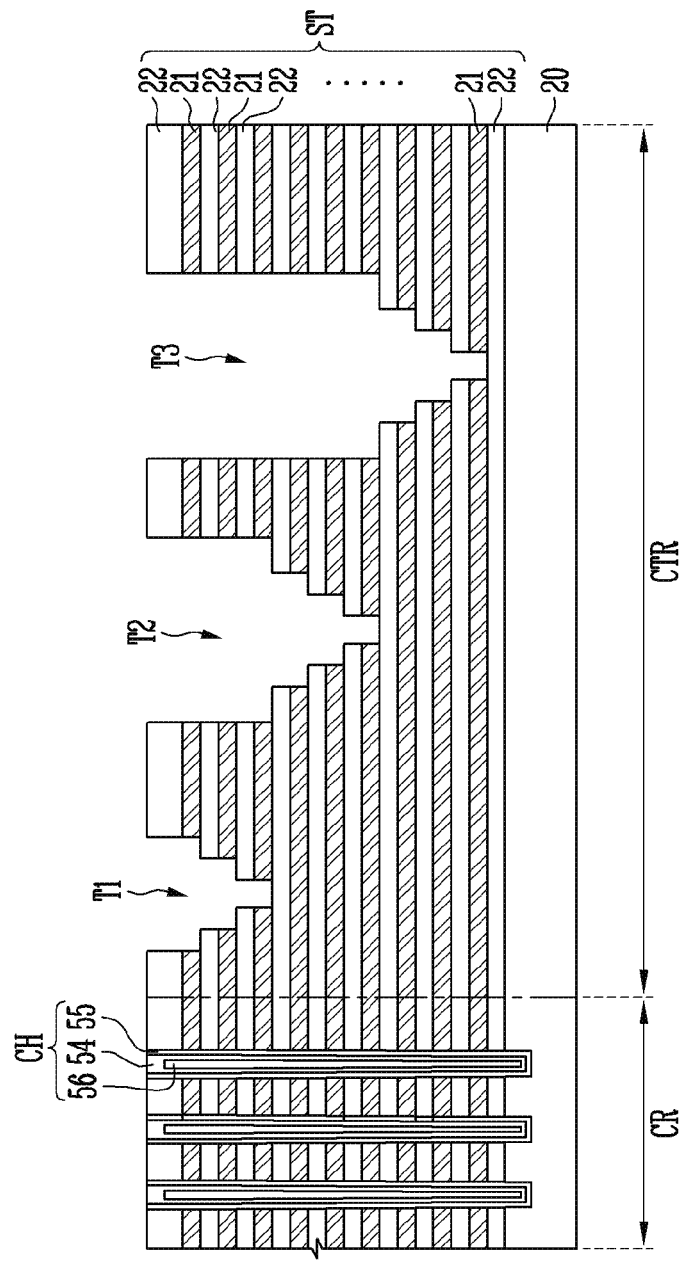

Referring to FIGS. 2A and 2B, the first to third trenches T1 to T3 having different depths may be formed. The first to third trenches T1 to T3 may be located in the contact region CTR.

The first to third trenches T1 to T3 may be formed by repeating an etch process. First, referring to FIG. 2A, after a mask pattern 50 is formed on the stacked structure ST, an etch process of the stacked structure ST and a process of reducing the mask pattern 50 may be alternately performed. As a result, the first trench T1, a preliminary second trench P_T2, and a preliminary third trench P_T3 having stepped inner walls may be formed. Each of the preliminary second trench P_T2 and the preliminary third trench P_T3 may have substantially the same depth as the first trench T1. Subsequently, referring to FIG. 2B, by etching the stacked structure ST, the preliminary second trench P_T2 and the preliminary third trench P_T3 may be extended deeper into the stacked structure ST. As a result, the stepped inner walls may be shifted downward onto the lower conductive layers 11 and the lower insulating layers 12, so that the second trench T2 and the third trench T3 may be formed.

As a result, the first to third trenches T1 to T3 having different depths may be formed. The first trench T1 may be adjacent to the cell region CR and the third trench T3 may be apart from the cell region CR. The second trench T2 may have a greater depth than the first trench T1 and the third trench T3 may have a greater depth than the second trench T2. The first to third trenches T1 to T3 may have substantially the same or different widths. The second trench T2 may have a greater width than the first trench T1 and the third trench T3 may have a greater width than the second trench T2. For example, deeper trenches may also have greater widths.

Figure 2C:
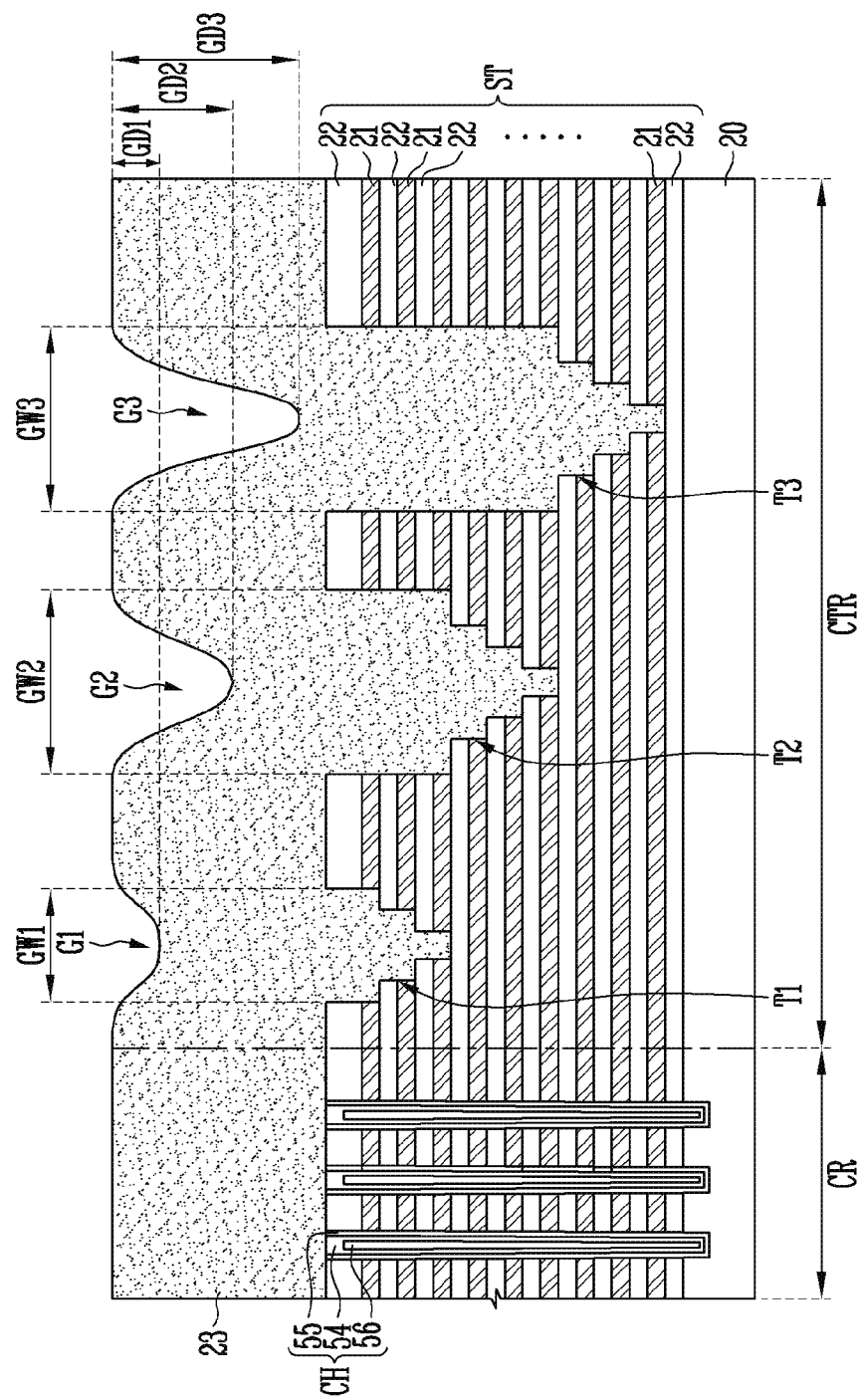

Referring to FIG. 2C, an insulating layer 23 may be formed over the stacked structure ST. The insulating layer 23 may cover the cell region CR and the contact region CTR and fill the first to third trenches T1 to T3. The insulating layer 23 may include an insulating material such as an oxide. The insulating layer 23 may be thick enough to fill the first to third trenches T1 to T3.

The insulating layer 23 may be formed using a deposition process. When the deposition process is used, the insulating material may be deposited along the profile of the first to third trenches T1 to T3. Thus, the shapes of the first to third trenches T1 to T3 may be reflected onto an upper surface of the insulating layer 23. The upper surface of the insulating layer 23 may include first to third grooves G1 to G3.

The first to third grooves G1 to G3 may be located corresponding to the first to third trenches T1 to T3, respectively. The first to third grooves G1 to G3 may have different depths. The depths of the first to third grooves G1 to G3 may be in proportion to the depths of the first to third trenches T1 to T3. The third groove G3 may have a greater depth than the second groove G2 (GD3>GD2) and the second groove G2 may have a greater depth than the first groove G1 (GD2>GD1). In addition, the first to third grooves G1 to G3 may have different widths. The widths of the first to third grooves G1 to G3 may be in proportion to the widths of the first to third trenches T1 to T3. The third groove G3 may have a greater width than the second groove G2 (GW3>GW2), and the second groove G2 may have a greater width than the first groove G1 (GW2>GW1).

Figure 2D:
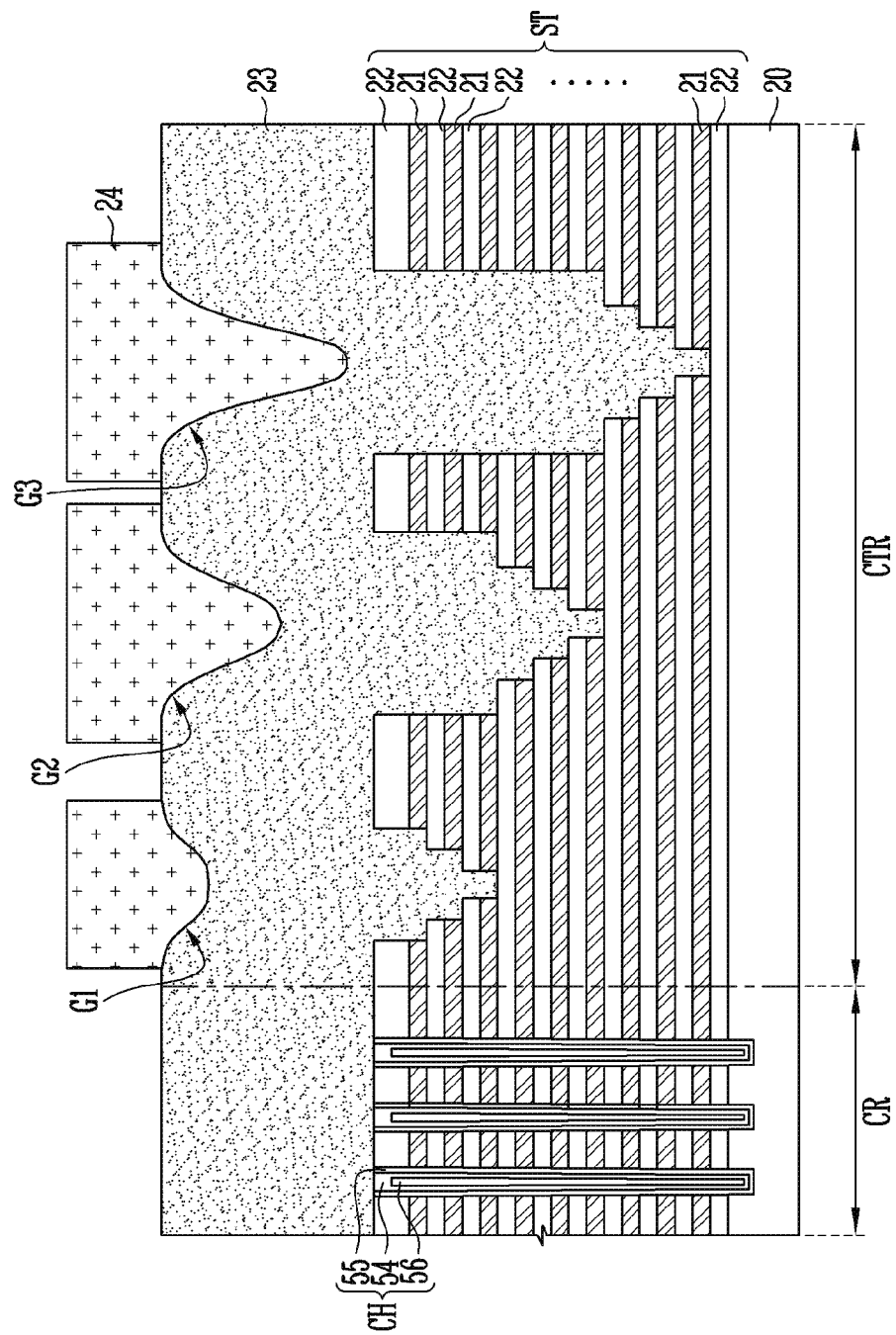

Referring to FIG. 2D, a mask pattern 24 may be formed on the insulating layer 23. The mask pattern 24 may cover the first to third grooves G1 to G3 and expose the cell region CR. Patterns included in the mask pattern 24 may cover the first to third grooves G1 to G3.

Figure 2E:
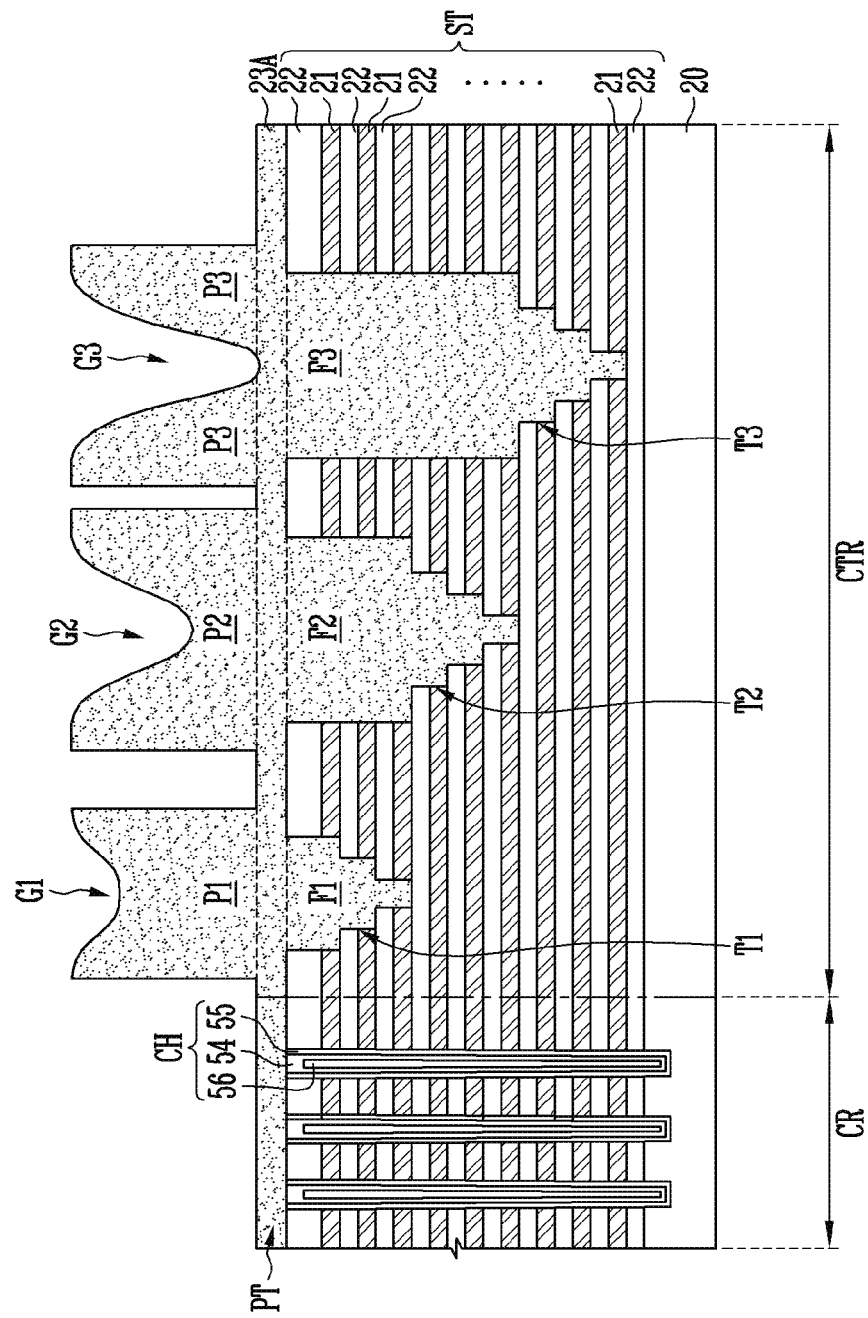

Referring to FIG. 2E, the insulating layer 23 may be patterned using the mask pattern 24 as an etch barrier. A patterned insulating layer 23A may include a plate PT, a plurality of fillers F1 to F3, and a plurality of protrusions P1 to P3. The plate PT may cover the cell region CR and the contact region CTR, and the plurality of fillers may fill the first to third trenches T1 to T3. The first to third protrusions P1 to P3 may protrude from the plate PT.

The first to third protrusions P1 to P3 may be located corresponding to the first to third trenches T1 to T3, respectively. The first to third protrusions P1 to P3 may include the first to third grooves G1 to G3, respectively.

Figure 2F:
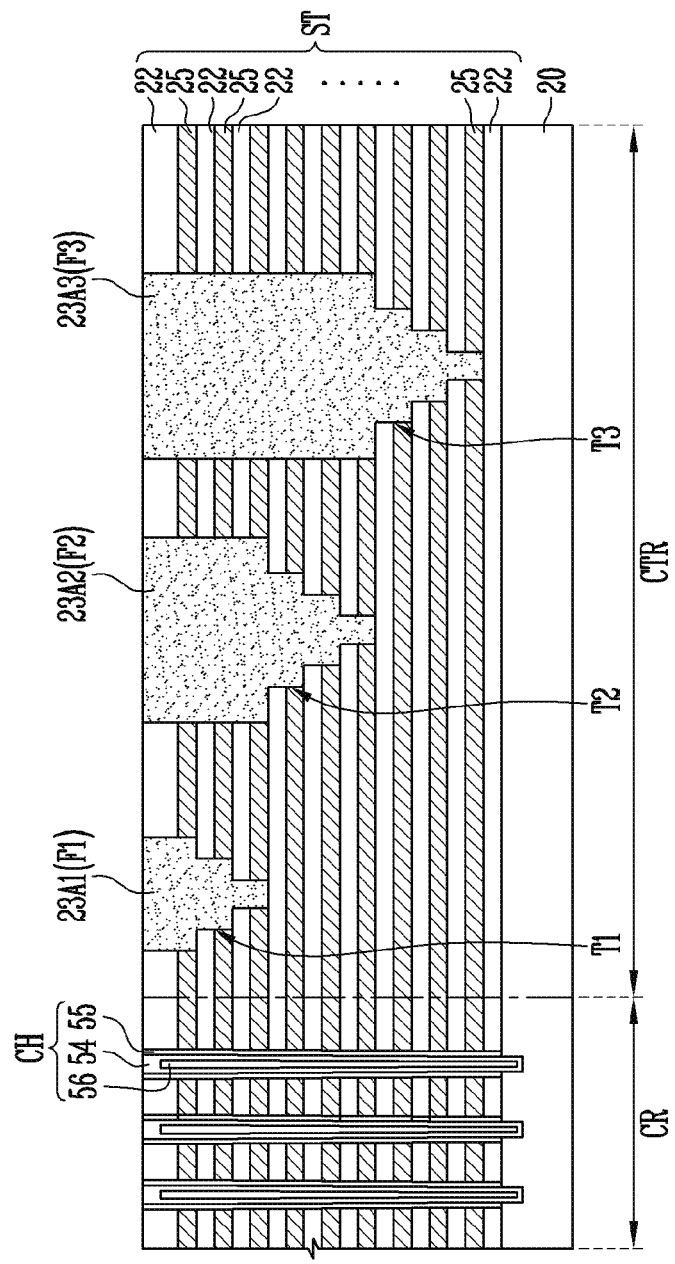

Referring to FIG. 2F, the patterned insulating layer 23A may be planarized to form first to third insulating patterns 23A1 to 23A3. The first to third insulating patterns 23A1 to 23A3 may correspond to the first to third fillers F1 to F3, respectively. The patterned insulating layer 23A may be planarized by chemical mechanical polishing (CMP). This planarizing process may be performed until top surfaces of the channel structures CH or the top surface of the stacked structure ST is exposed.

The first to third insulating patterns 23A1 to 23A3 may fill the first to third trenches T1 to T3, respectively. In addition, the top surface of the stacked structure ST and top surfaces of the first to third insulating patterns 23A1 to 23A3 may be located at substantially the same level. In other words, the top surface of the stacked structure ST and the top surfaces of the first to third insulating patterns 23A1 to 23A3 may be located in the same plane.

Subsequently, the first material layers 21 may be replaced by third material layers 25. For example, when the first material layers 21 are sacrificial layers and the second material layers 22 are insulating layers, the first material layers 21 may be replaced by conductive layers. In another example, when the first material layers 21 are conductive layers and the second material layers 22 are insulating layers, the first material layers 21 may be silicided.

In addition, a process of coupling the source structure in the base 20 to the channel structures CH may be performed. For example, an opening may be formed by removing a sacrificial layer in the source structure. Subsequently, a channel layer 54 may be exposed by partially etching the memory layer 55 through the opening and a source layer coupled to the channel layer 54 may be formed in the opening.

According to the above-described process, the insulating layer 23 may be patterned before the insulating layer 23 is planarized. By patterning the insulating layer 23 using the mask pattern used to open the cell region CR, the thickness of the insulating layer 23 formed in the cell region CR may be reduced. Therefore, the polishing amount of the insulating layer 23 and the time consumed for the planarizing process may be reduced.

In addition, the insulating layer 23 may be patterned using the mask pattern 24 covering the first to third grooves G1 to G3. Therefore, the patterned insulating layer 23A may include the first to third protrusions P1 to P3, and damage to the insulating layer 23 in the first to third trenches T1 to T3 may be mitigated or prevented during the patterning process. During the planarizing process, damage to the stacked structure ST may be mitigated or prevented.

Figure 3A:
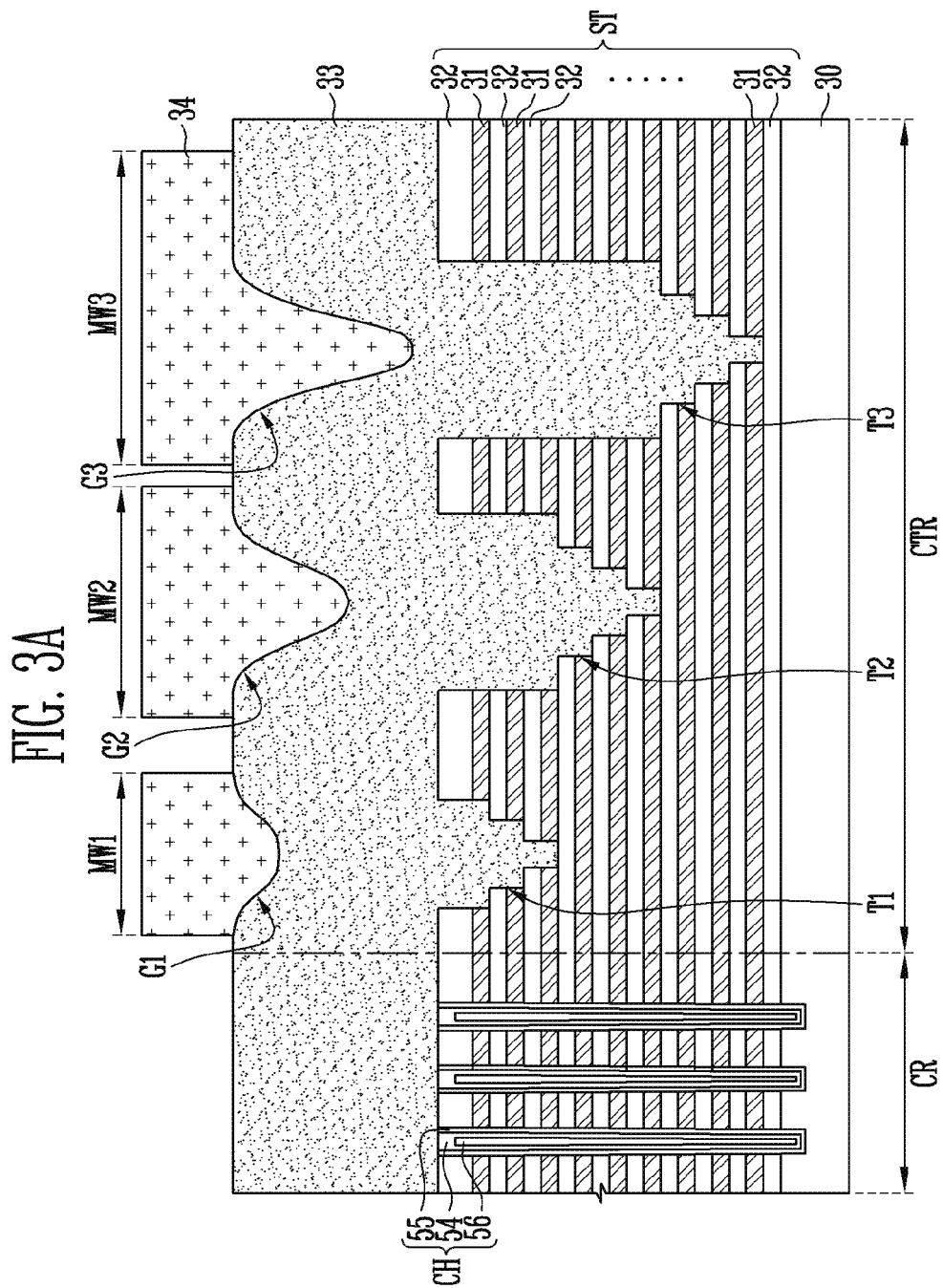
FIGS. 3A to 3C are diagrams illustrating a method of manufacturing a semiconductor device according to an embodiment of the present disclosure.
Figure 3B:
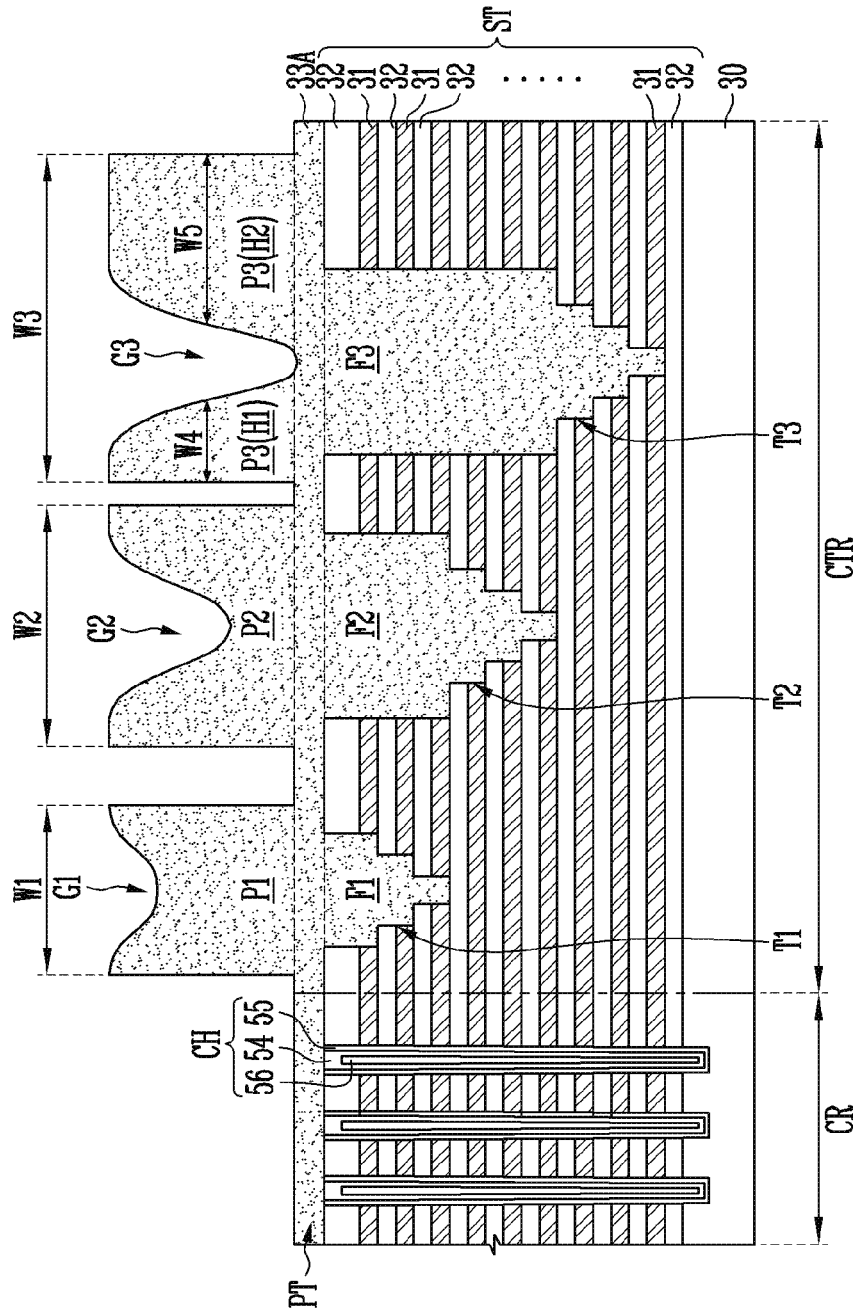
Figure 3C:
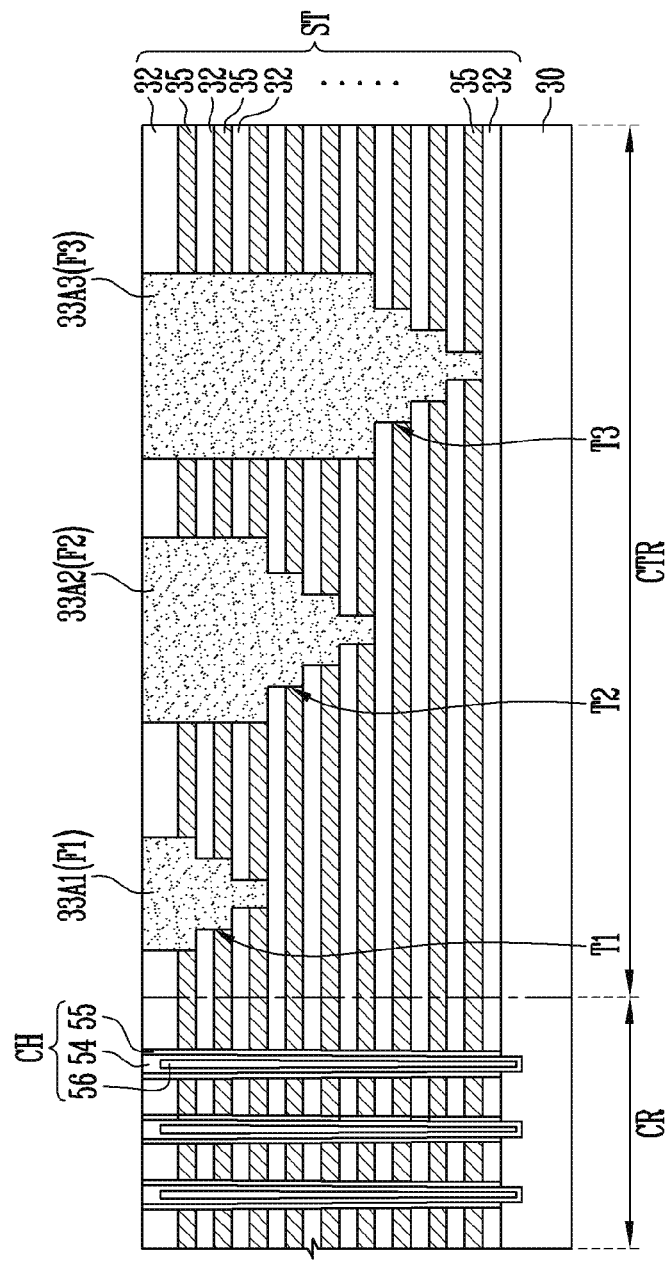

FIGS. 3A to 3C are diagrams illustrating a method of manufacturing a semiconductor device according to an embodiment. Hereinafter, repeated descriptions of common contents already described above are omitted.

Referring to FIG. 3A, the stacked structure ST may be formed on a base 30. In addition, the stacked structure ST may include first material layers 31 and second material layers 32 which are alternately stacked with each other.

Subsequently, the channel structure CH including the channel layer 54, the memory layer 55, and the gap-filling layer 56 may be formed.

Subsequently, the first to third trenches T1 to T3 having different depths may be formed. The second trench T2 may have a greater depth than the first trench T1 and the third trench T3 may have a greater depth than the second trench T2. Subsequently, an insulating layer 33 may be formed on the stacked structure ST. The insulating layer 33 may be formed to fill the first to third trenches T1 to T3. Subsequently, a mask pattern 34 may be formed on the insulating layer 33. The mask pattern 34 may cover the first to third grooves G1 to G3 in the insulating layer 33 and expose the cell region CR.

Patterns included in the mask pattern 34 may cover the first to third grooves G1 to G3. At least one of the patterns may have a greater width than other patterns (MW3>MW1 and MW3>MW2).

Referring to FIG. 3B, the insulating layer 33 may be patterned using the mask pattern 34 as an etch barrier. A patterned insulating layer 33A may include the plate PT, the plurality of fillers F1 to F3, and the plurality of protrusions P1 to P3. At least one of the protrusions P1 to P3 may have a greater width than the other protrusions.

Widths W1 to W3 of the first to third protrusions P1 to P3 may be determined in consideration of the force of static friction during the planarizing process. When the planarizing process is performed, the force of static friction may be concentrated on the first to third protrusions P1 to P3, and the force of static friction may be concentrated on some of the first to third protrusions P1 to P3. The force of static friction may be more concentrated on a protrusion apart from the cell region CR than on a protrusion adjacent to the cell region CR. The force of static friction may be more concentrated on a protrusion located in an edge area of a wafer than on a protrusion located in a central area of the wafer. When the force of static friction is concentrated on some of the protrusions, a pattern in the corresponding area may collapse or be depressed during the planarizing process. Therefore, according to an embodiment of the present disclosure, a protrusion located in an area where the force of static friction is concentrated may have a greater width than another protrusion.

The third protrusion P3 may be spaced apart from the cell region CR, or may be located in the edge area of the wafer. In addition, when then planarizing process is performed, the force of static friction may be concentrated on the third protrusion P3. Therefore, by forming the third protrusion P3 having a greater width than the first and second protrusions P1 and P2 (W3>W1 and W3>W2), the force of static friction concentrated on the third protrusion P3 may be dispersed. The force of static friction exerted on the third protrusion P3 may be reduced.

According to an embodiment, the widths W1 to W3 of the first to third protrusions P1 to P3 may be in proportion to the force of static friction. As the force of static friction is greater, the widths W1 to W3 of the first to third protrusions may be gradually greater (W1<W2<W3). According to an embodiment, at least one protrusion whose force of static friction is greater than or equal to a threshold value may have a greater width than other protrusions (W3>W2 and W3>W1). According to an embodiment, the first to third protrusions P1 to P3 may be grouped, and protrusions in a group with a higher force of static friction may have a greater width or widths than protrusions in a group with a lower force of friction.

The first to third protrusions P1 to P3 may include the first to third grooves G1 to G3, respectively. The first to third grooves G1 to G3 may have different depths. The protrusions P1 to P3 may include horned structures H1 and H2 defined by the grooves G1 to G3. At least one of the first to third protrusions P1 to P3 may include the horned structures H1 and H2.

The third protrusion P3 may include the horned structure H1 on one side and the horned structure H2 on the other side. The horned structure H1 on one side may be located adjacent to the cell region CR and the horned structure H2 on the other side may be spaced apart from the cell region CR. The horned structure H1 on one side and the horned structure H2 on the other side may have different widths (W4≠W5), and the horned structure H2 may have a greater width than the horned structure H1 (W5>W4).

Referring to FIG. 3C, the patterned insulating layer 33A may be planarized to form first to third insulating patterns 33A1 to 33A3. The first to third insulating patterns 33A1 to 33A3 may correspond to the first to third fillers F1 to F3, respectively. The first to third insulating patterns 33A1 to 33A3 may fill the first to third trenches T1 to T3, respectively. Subsequently, the first material layers 31 may be replaced by third material layers 35. In addition, a process of coupling the source structure in the base 30 to the channel structures CH may be additionally performed.

According to the above-described processes, the widths W1 to W3 of the protrusions P1 to P3 may be controlled in consideration of the force of static friction during the planarizing process. In this manner, the concentration of the force of static friction on some protrusions may be minimized and damage to a lower structure, such as the stacked structure ST, may be mitigated or prevented.

Figure 4A:
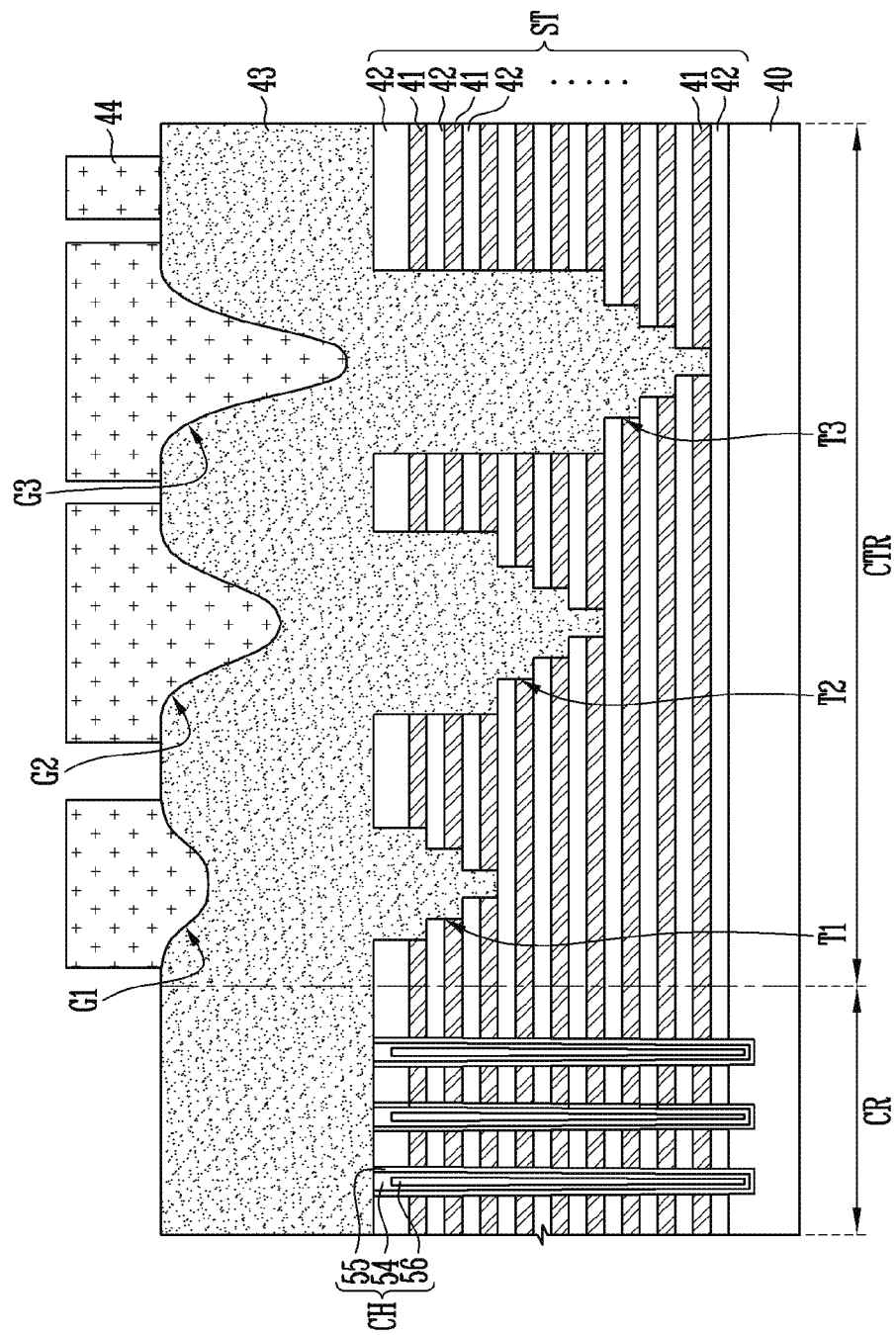
FIGS. 4A to 4C are diagrams illustrating a method of manufacturing a semiconductor device according to an embodiment of the present disclosure.
Figure 4B:
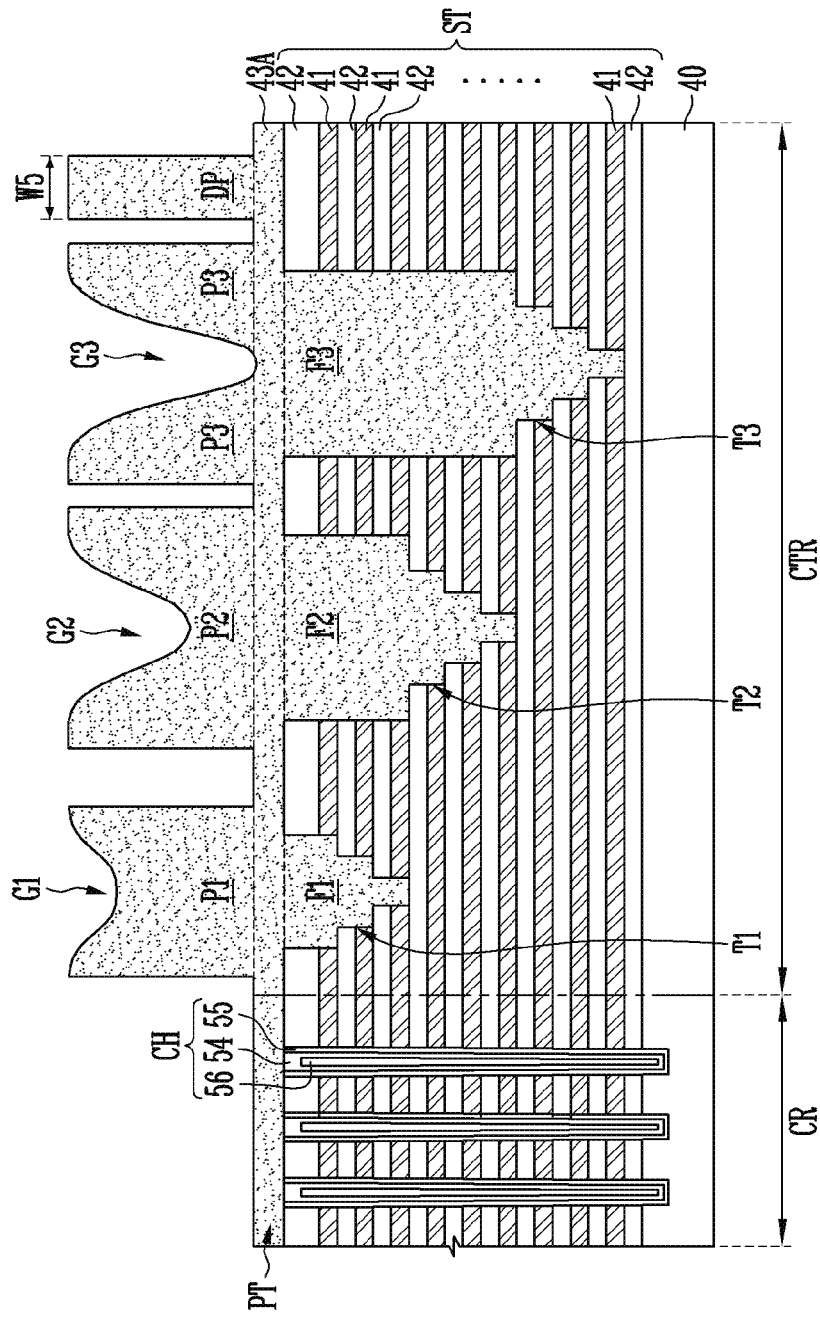
Figure 4C:
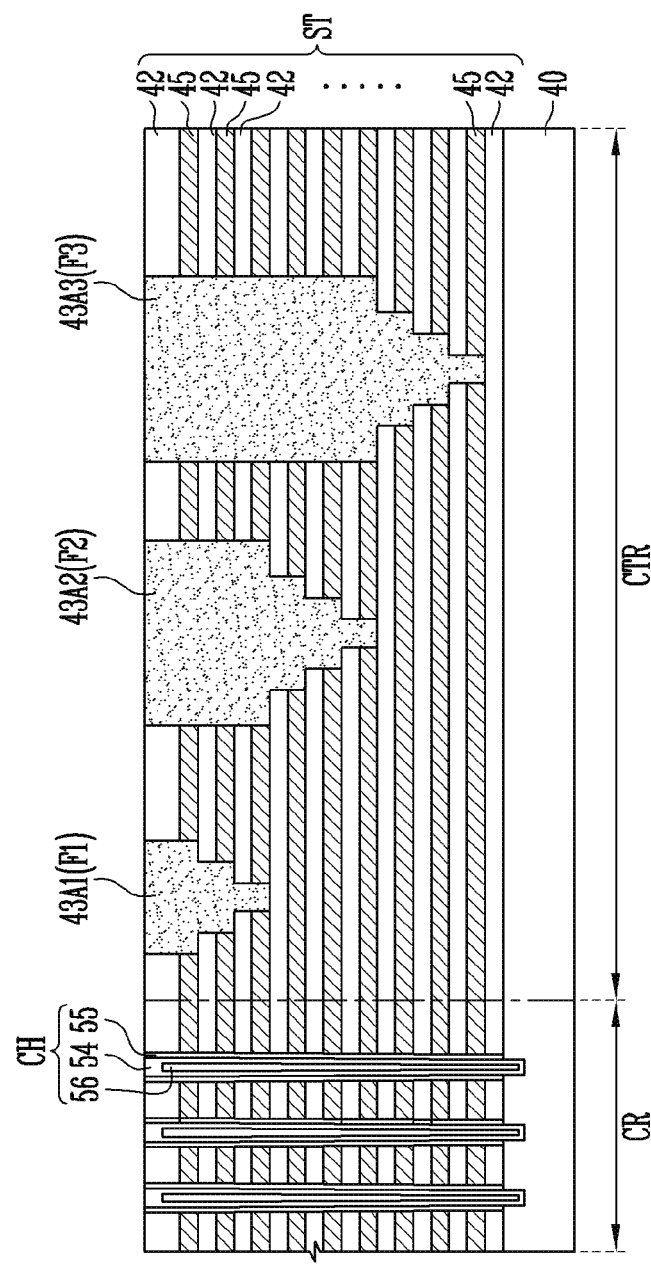

FIGS. 4A to 4C are diagrams illustrating a method of manufacturing a semiconductor device according to an embodiment. Hereinafter, repeated descriptions of common contents already described above are omitted.

Referring to FIG. 4A, the stacked structure ST may be formed on a base 40. In addition, the stacked structure ST may include first material layers 41 and second material layers 42 that are alternately stacked with each other. Subsequently, the channel structure CH including the channel layer 54, the memory layer 55, and the gap-filling layer 56 may be formed. Subsequently, the first to third trenches T1 to T3 having different depths may be formed.

Subsequently, an insulating layer 43 may be formed on the stacked structure ST. The insulating layer 43 may be formed to fill the first to third trenches T1 to T3. Subsequently, a mask pattern 44 may be formed on the insulating layer 43. The mask pattern 44 may be formed to cover a portion of the contact region CTR and expose the cell region CR. The mask pattern 44 may be formed to cover the first to third grooves G1 to G3 and further cover an area adjacent to the grooves G1 to G3.

Referring to FIG. 4B, the insulating layer 43 may be patterned using the mask pattern 44 as an etch barrier. A patterned insulating layer 43A may include the plate PT, the plurality of fillers F1 to F3, the plurality of protrusions P1 to P3, and at least one dummy protrusion DP.

The first to third protrusions P1 to P3 may be located corresponding to the first to third trenches T1 to T3, respectively. The first to third protrusions P1 to P3 may have the same width. Alternatively, at least one of the protrusions P1 to P3 may have a greater width or widths than other protrusions. For example, the third protrusion P3 may have a greater width than the first and second protrusions P1 and P2.

The dummy protrusion DP may be located at the area where the force of static friction is concentrated. The dummy protrusion DP may be located apart from the cell region CR, or may be located in the edge area of the wafer. The dummy protrusion DP may be located adjacent to the first to third protrusions P1 to P3. The dummy protrusion DP may be located to the same side of the first to third protrusions P1 to P3. As illustrated, the dummy protrusion DP is to the right side of the first to third protrusions P1 to P3, apart from the cell region CR. The dummy protrusion DP may be located between the first to third protrusions P1 to P3, or may be located next to the first protrusion P1 or the third protrusion P3. The third protrusion P3 may be located between the second protrusion P2 and the dummy protrusion DP. The dummy protrusion DP may have substantially the same depth as or different depths from one of the first to third protrusions P1 to P3. As a width W5 of the dummy protrusion DP is greater, the force of static friction may be effectively dispersed.

Referring to FIG. 4C, the patterned insulating layer 43A may be planarized to form first to third insulating patterns 43A1 to 43A3. The first to third insulating patterns 43A1 to 43A3 may correspond to the first to third fillers F1 to F3, respectively. The first to third insulating patterns 43A1 to 43A3 may fill the first to third fillers F1 to F3, respectively. Subsequently, the first material layers 41 may be replaced by third material layers 45. In addition, a process of coupling the source structure in the base 40 to the channel structures CH may be additionally performed.

According to the above-described process, by additionally forming the dummy protrusion DP in the area where the force of static friction is concentrated, the force of static friction may be dispersed. In addition, by increasing the width of the protrusion in the area where the force of static friction is concentrated, and additionally forming the dummy protrusion DP, the force of static friction may be effectively dispersed.

Figure 5:
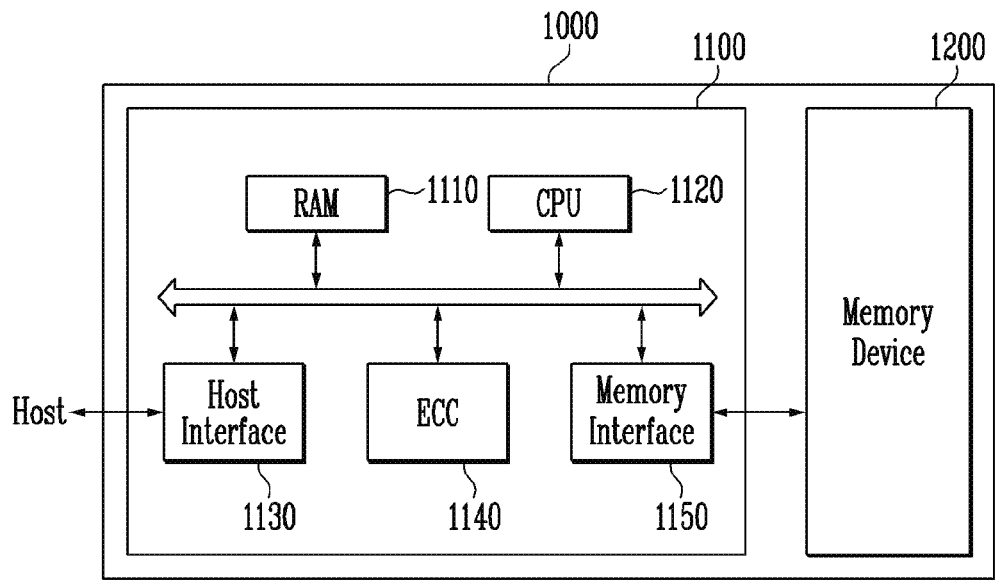
FIG. 5 is a block diagram illustrating a configuration of a memory system according to an embodiment of the present disclosure.

FIG. 5 is a block diagram illustrating the configuration of a memory system 1000 according to an embodiment of the present disclosure.

Referring to FIG. 5, the memory system 1000 may include a memory device 1200 and a controller 1100.

The memory device 1200 may be used to store various types of data such as text, graphics, and software codes. The memory device 1200 may be a non-volatile memory device. Furthermore, the memory device 1200 may have the structure described above with reference to FIGS. 1A to 4C, and may be manufactured by the manufacturing method described above with reference to FIGS. 1A to 4C. Because the memory device 1200 is configured and manufactured in the same manner as described above, a detailed description thereof is not repeated here.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may temporarily store data externally transferred through the host interface 1130, or temporarily store data transferred from the memory device 1200 through the memory interface 1150. In addition, the controller 1100 may further include a ROM that stores code data for interfacing with the host.

Because the memory system 1000 according to an embodiment includes the memory device 1200 having improved integration density and characteristics, the memory system 1000 may also have improved integration density and characteristics accordingly.

Figure 6:
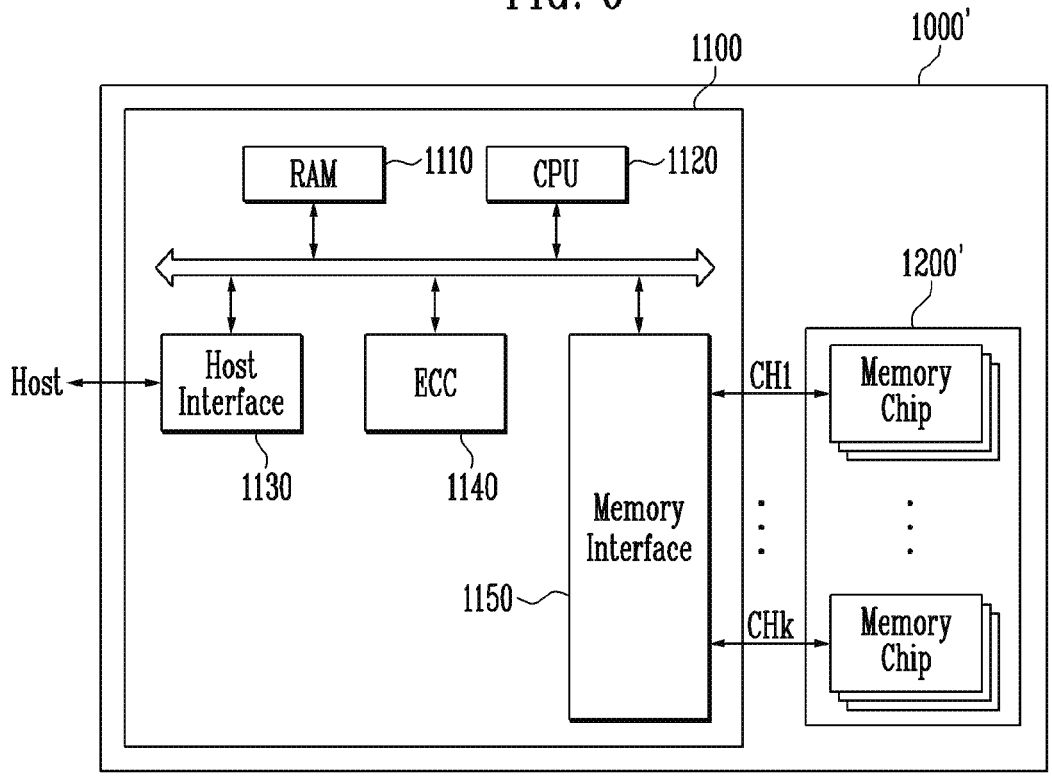
FIG. 6 is a block diagram illustrating a configuration of a memory system according to an embodiment of the present disclosure.

FIG. 6 is a block diagram illustrating the configuration of a memory system 1000' according to an embodiment of the present disclosure. In the following description, repeated descriptions of certain elements already described above are omitted for the sake of brevity.

As illustrated in FIG. 6, the memory system 1000' may include a memory device 1200' and the controller 1100. The controller 1100 may include a RAM 1110, a CPU 1120, a host interface 1130, an ECC circuit 1140, and a memory interface 1150.

The memory device 1200' may be a non-volatile memory device. In addition, the memory device 1200' may have the structure described above with reference to FIGS. 1A to 4C, and may be manufactured by the fabricating method described above with reference to FIGS. 1A to 4C. Because the memory device 1200' is configured and fabricated in the same manner as described above, a repeated description thereof will be omitted here.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. For reference, the memory system 1000' may be modified such that each memory chip may be coupled to a corresponding single channel.

As described above, because the memory system 1000' according to an embodiment includes the memory device 1200' having improved integration and characteristics, the integration and characteristics of the memory system 1000' may also be improved. In addition, because the memory device 1200' is formed as a multi-chip package, data storage capacity and driving speed of the memory system 1000' may be further increased.

Figure 7:
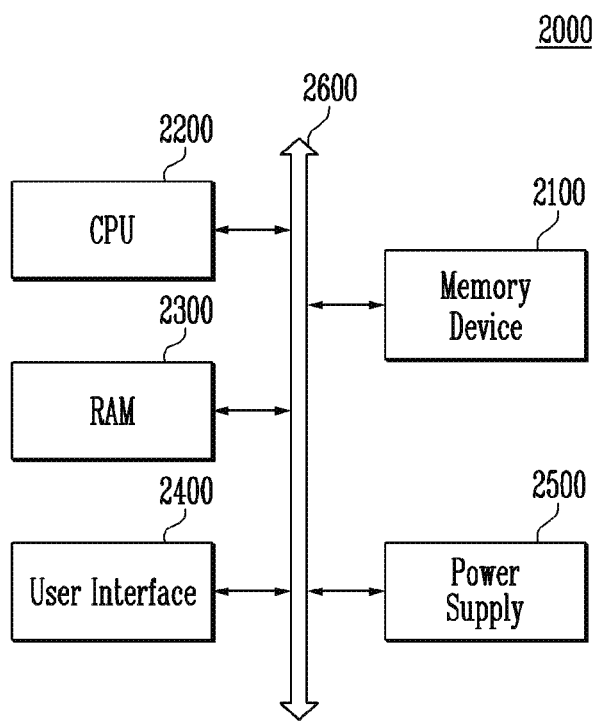
FIG. 7 is a block diagram illustrating a configuration of a memory system according to an embodiment of the present disclosure.

FIG. 7 is a block diagram illustrating a configuration of a computing system 2000 according to an embodiment of the present disclosure. In the following description, repeated descriptions of certain elements already described above are omitted for the sake of brevity.

As illustrated in FIG. 7, the computing system 2000 may include a memory device 2100, a CPU 2200, a random-access memory (RAM) 2300, a user interface 2400, a power supply 2500, and a system bus 2600.

The memory device 2100 may store data provided via the user interface 2400, data processed by the CPU 2200, etc. The memory device 2100 may be electrically coupled to the CPU 2200, the RAM 2300, the user interface 2400, and the power supply 2500 by the system bus 2600. For example, the memory device 2100 may be coupled to the system bus 2600 via a controller (not shown), or directly to the system bus 2600. When the memory device 2100 is directly coupled to the system bus 2600, functions of the controller may be performed by the CPU 2200 and the RAM 2300.

The memory device 2100 may be a nonvolatile memory. In addition, the memory device 2100' may have the structure described above with reference to FIGS. 1A to 4C, and may be manufactured by the fabricating method described above with reference to FIGS. 1A to 4C. Because the memory device 2100 is configured and manufactured in the same manner as described above, a detailed description thereof will be omitted.

In addition, as described above with reference to FIG. 6, the memory device 2100 may be a multi-chip package composed of a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, because the computing system 2000 according to an embodiment includes the memory device 2100 having improved integration and characteristics, the characteristics of the computing system 2000 may also be improved.

Figure 8:
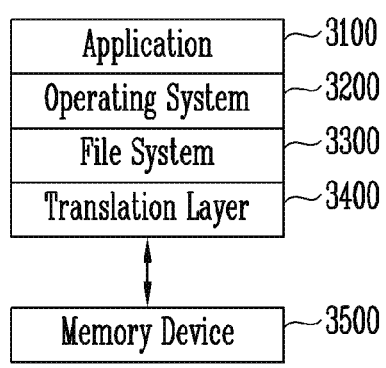
FIG. 8 is a block diagram illustrating the configuration of a computing system according to an embodiment of the present disclosure.

FIG. 8 is a block diagram illustrating a configuration of a computing system 3000 according to an embodiment of the present disclosure.

As illustrated in FIG. 8, the computing system 3000 may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 8 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. In addition, the memory device 3500 may have the structure described above with reference to FIGS. 1A to 4C, and may be manufactured by the fabricating method described above with reference to FIGS. 1A to 4C. Because the memory device 3500 is configured and manufactured in the same manner as described above, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, because the computing system 3000 according to an embodiment includes the memory device 3500 having improved integration density and characteristics, characteristics of the computing system 3000 may also be improved.

In accordance with various embodiments of the present teachings, a semiconductor device having a stabilized structure and improved reliability may be provided. In addition, a method of manufacturing a semiconductor device may be simplified with lower manufacturing costs.

It will be apparent to those skilled in the art that various modifications can be made to any of the above-described embodiments of the present teachings without departing from the spirit or scope of the present teachings. Thus, it is intended that the present teachings cover all such modifications provided they come within the scope of the appended claims and their equivalents.

What is claimed is:

1. A method of manufacturing a semiconductor device, the method comprising:

forming a stacked structure including trenches having different depths wherein the trenches have stepped structures, respectively;

forming an insulating layer on the stacked structure to fill the trenches;

forming a plurality of protrusions located over locations of the trenches by patterning the insulating layer, wherein the plurality of protrusions has grooves, and each of the grooves has a lowest point overlapping with a lowest point of a corresponding stepped structure among the stepped structures of the trenches; and forming insulating patterns filling the trenches, respectively, by planarizing a patterned insulating layer including the plurality of protrusions.

2. The method of claim 1, wherein at least one of the plurality of protrusions has a greater width than remaining protrusions.

3. The method of claim 1, wherein a protrusion apart from a cell region, among the plurality of protrusions, has a greater width than a protrusion adjacent to the cell region.

4. The method of claim 1, wherein a protrusion having a higher force of static friction has a greater width than a protrusion having a lower force of static friction when the patterned insulating layer is planarized.

5. The method of claim 1, wherein the patterned insulating layer includes a dummy protrusion located adjacent to the plurality of protrusions.

6. The method of claim 5, wherein the stacked structure includes a cell region and a contact region, wherein the plurality of protrusions and the dummy protrusion are located in the contact region, and wherein the dummy protrusion is located farther apart from the cell region than the plurality of protrusions.

7. The method of claim 1, wherein the grooves have different depths.

8. The method of claim 1, wherein the grooves are located corresponding to locations of the trenches.

9. The method of claim 1, wherein a groove corresponding to a deeper trench has a greater depth than a groove corresponding to a shallower trench.

10. The method of claim 1, wherein each of the trenches has a stepped inner wall.

11. The method of claim 1, wherein each of the protrusions has horn structures on both sides of the groove.

12. The method of claim 11, wherein a portion of the insulating layer remains as a plate on the stack structure between the protrusions, in a process of the patterning the insulating layer, wherein each of the horn structures is higher than the plate of the insulating layer.

13. A method of manufacturing a semiconductor device, the method comprising:

forming a stacked structure including a cell region and a contact region;

forming, in the contact region of the stacked structure, a first trench adjacent to the cell region and a second trench apart from the cell region;

forming an insulating layer on the stacked structure to fill the first and second trenches; patterning the insulating layer to form a first protrusion over the first trench and a second protrusion over the second trench, wherein the second protrusion is wider than the first protrusion, wherein the first protrusion includes a first groove and the second protrusion includes a second groove, wherein each of the first groove and the second groove has a lowest point overlapping with each of lowest point of the trenches; and planarizing a patterned insulating layer including the first protrusion and the second protrusion.

14. The method of claim 13, wherein the second protrusion has a greater width than the first protrusion.

15. The method of claim 13, wherein the patterned insulating layer includes a dummy protrusion adjacent to the second protrusion.

16. The method of claim 15, wherein the dummy protrusion is located farther apart from the cell region than the first and second protrusions.

17. The method of claim 13, wherein a depth of the first groove is different than a depth of the second groove.

18. The method of claim 13, wherein the first groove is located corresponding to a location of the first trench and the second groove is located corresponding to a location of the second trench.

19. The method of claim 13, wherein a depth of the second trench is greater than a depth of the first trench, and wherein the depth of the second groove is greater than the depth than the first groove.

20. The method of claim 13, wherein each of the first and second trenches has a stepped inner wall.

* * * * *